(12) United States Patent
Tong et al.

(10) Patent No.: US 10,883,190 B2
(45) Date of Patent: Jan. 5, 2021

(54) APPARATUS AND METHODS FOR ALIGNMENT OF A SUSCEPTOR

(71) Applicant: Applied Materials, Inc., Santa Clara, CA (US)

(72) Inventors: Edric Tong, Sunnyvale, CA (US); James Francis Mack, Woodside, CA (US); Paul Brillhart, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 497 days.

(21) Appl. No.: 14/796,048

(22) Filed: Jul. 10, 2015

(65) Prior Publication Data

US 2016/0010239 A1 Jan. 14, 2016

Related U.S. Application Data

(60) Provisional application No. 62/023,625, filed on Jul. 11, 2014, provisional application No. 62/039,210, filed on Aug. 19, 2014.

(51) Int. Cl.

| | |
|---|---|
| *C30B 25/08* | (2006.01) |
| *C23C 16/458* | (2006.01) |
| *H05B 3/68* | (2006.01) |
| *C30B 23/06* | (2006.01) |
| *C30B 25/10* | (2006.01) |
| *C30B 25/12* | (2006.01) |

(Continued)

(52) U.S. Cl.
CPC .......... *C30B 25/08* (2013.01); *C23C 16/4584* (2013.01); *C30B 23/06* (2013.01); *C30B 25/10* (2013.01); *C30B 25/12* (2013.01); *C30B 35/005* (2013.01); *H05B 3/0047* (2013.01); *H05B 3/68* (2013.01)

(58) Field of Classification Search
CPC ....... H05B 3/0047; C30B 25/08; C30B 25/06; C30B 25/10; C30B 25/12; C23C 16/4584; H01L 21/68764; H01L 21/68792; H01L 21/68785
USPC ......................................................... 392/416
See application file for complete search history.

(56) References Cited

U.S. PATENT DOCUMENTS 5,062,386 A * 11/1991 Christensen ........ C23C 16/4411
  118/715
5,135,098 A * 8/1992 Koibuchi ........... H05K 13/0417
  198/345.1

(Continued)

OTHER PUBLICATIONS

International Search Report and Written Opinion for Application No. PCT/2015/034732 dated Jun. 8, 2015.

(Continued)

*Primary Examiner* — Erin E McGrath
(74) *Attorney, Agent, or Firm* — Patterson + Sheridan LLP

(57) ABSTRACT

The embodiments described herein generally relate to a stem assembly for coupling a susceptor to a process chamber. The stem assembly includes a pivot mechanism, a first flexible seal coupled to the pivot mechanism, a second flexible seal coupled to a plate on a first side of the plate, the plate having a second side coupled to the first flexible seal, a housing coupled to the second flexible seal, and a motion assembly adapted to move the housing in an X axis and a Y axis, and position the susceptor angularly relative to an X-Y plane of the process chamber.

16 Claims, 5 Drawing Sheets

(51) Int. Cl.
  *C30B 35/00* (2006.01)
  *H05B 3/00* (2006.01)

(56) References Cited

U.S. PATENT DOCUMENTS

| | | | |
|---|---|---|---|
| 5,421,893 A | 6/1995 | Perlov | |
| 5,569,350 A * | 10/1996 | Osada | C23C 16/4586 118/500 |
| 6,559,461 B1 * | 5/2003 | Seo | H01J 37/3171 250/398 |
| 2001/0050041 A1 * | 12/2001 | Reardon | H01L 21/67075 118/52 |
| 2005/0042807 A1 | 2/2005 | Pharand et al. | |
| 2006/0240542 A1 | 10/2006 | Schieve et al. | |
| 2009/0276097 A1 | 11/2009 | Patalay et al. | |
| 2009/0283042 A1 | 11/2009 | Du et al. | |
| 2010/0294199 A1 * | 11/2010 | Tran | C23C 16/4401 118/723 R |

OTHER PUBLICATIONS

Taiwan Office Action for Application No. TW 104118822 dated Nov. 21, 2018.
Chinese Office Action for Application No. 201580036364.8 dated Mar. 25, 2020.

* cited by examiner

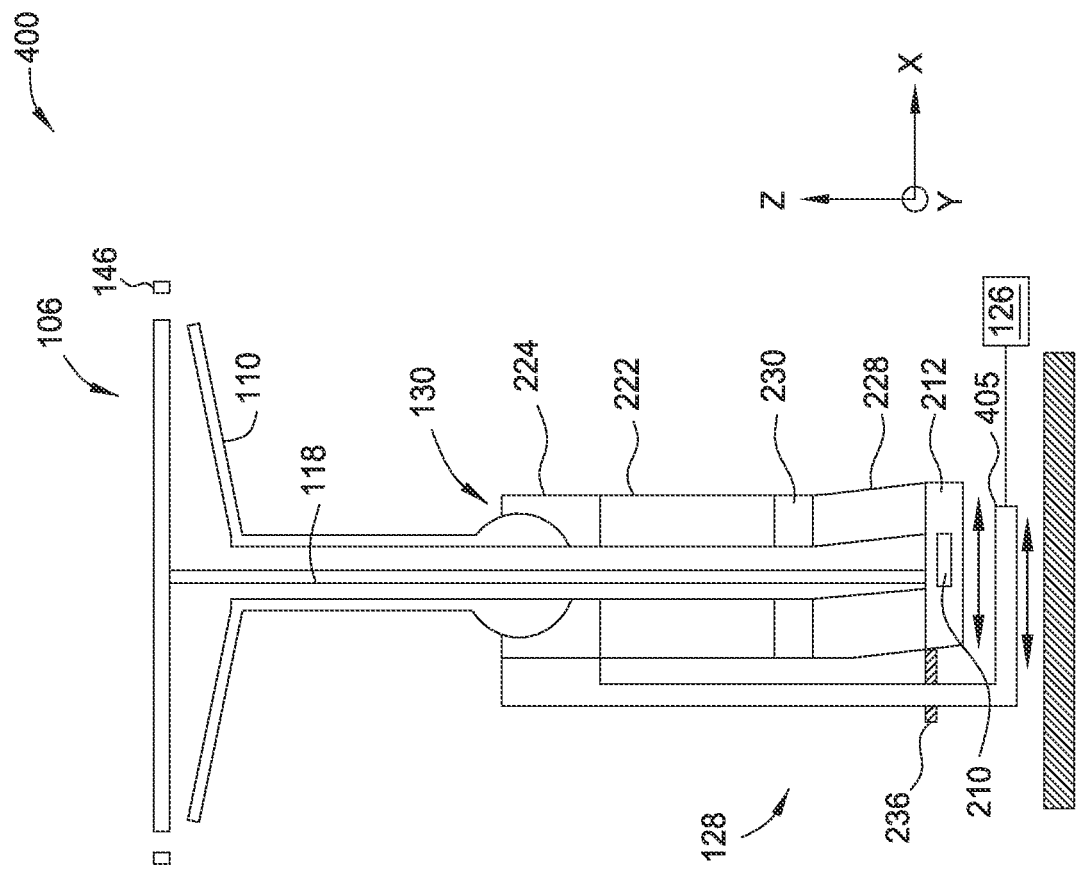
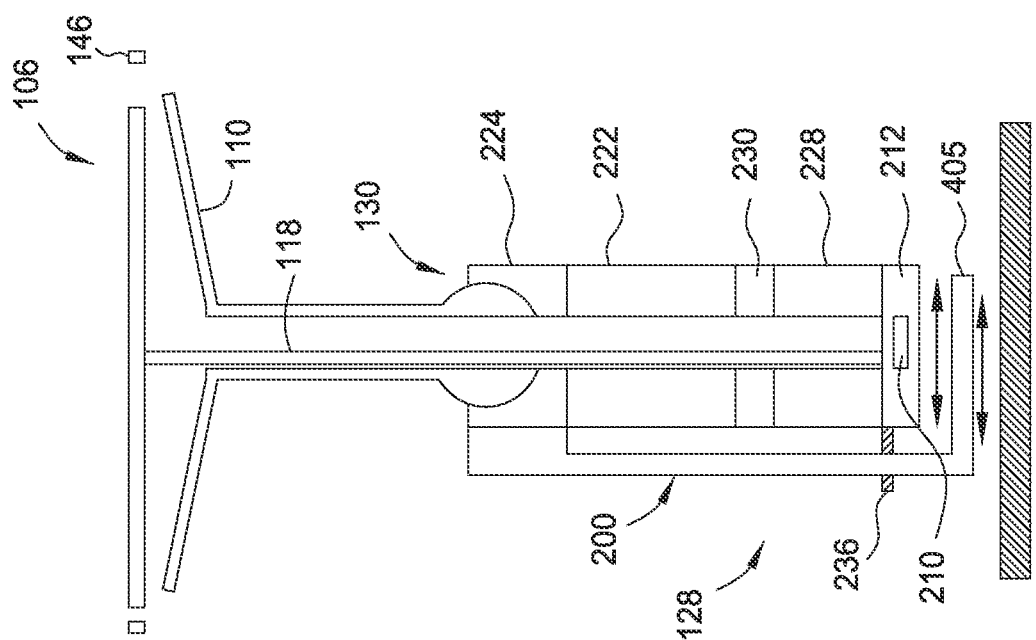
FIG. 4A
FIG. 4B

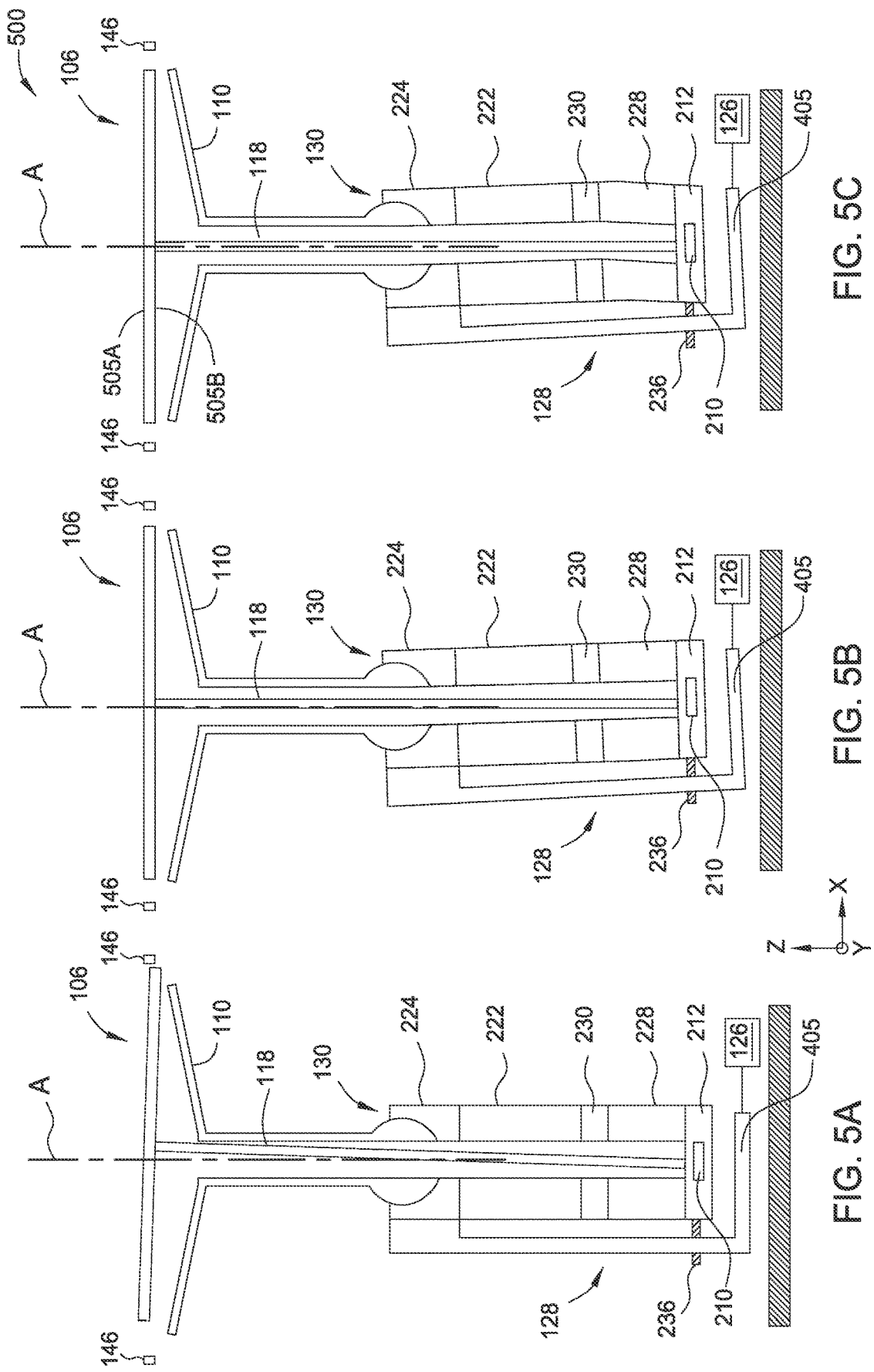

APPARATUS AND METHODS FOR ALIGNMENT OF A SUSCEPTOR

CROSS-REFERENCE TO RELATED APPLICATIONS

This application claims benefit of U.S. Provisional Patent Application Ser. No.: 62/023,625 filed Jul. 11, 2014, and U.S. Provisional Patent Application Ser. No.: 62/039,210 filed Aug. 19, 2014, both applications are hereby incorporated by reference herein.

BACKGROUND

Field

Embodiments disclosed herein generally relate to semiconductor processing and more specifically to a method and apparatus for aligning a susceptor in a thermal processing chamber.

Description of the Related Art

Thermal processing chambers, such as rapid thermal processing (RTP) and epitaxial chambers are employed in semiconductor chip fabrication to create, chemically alter, or etch surface structures on semiconductor substrates. RTP and epitaxial chambers typically heat the substrate using an array of high-intensity lamps. The lamps heat the substrate to temperatures up to or exceeding about 1,000 degrees Celsius in a short period of time. The substrate may then be cooled in the chamber in a short time period when the lamps are powered off. The chambers are typically made of quartz to withstand the high temperature as well as the temperature changes. The large temperature range experienced by the chamber causes significant thermal expansion and contraction. Loose tolerances between parts are generally required with quartz materials to enable the thermal expansion which makes precise alignment of chamber components difficult.

Precise alignment of a susceptor, or substrate support, within the chamber is difficult. The typical desired position of the susceptor is to center the susceptor in an X-Y plane of the chamber as well as having the substrate receiving surface of the susceptor parallel to the X-Y plane of the chamber. However, due to design constraints in conventional systems, the susceptor is not reliably placed at the desired position and orientation, which may create multiple processing issues. For example, in conventional systems, it may be chosen to center the susceptor in the X-Y plane, which may result in the susceptor being disposed in a plane that is not parallel (i.e., tilted) relative to the X-Y plane of the chamber. Susceptor tilt will most likely not be the same in multiple chambers, which produces numerous chamber matching issues including pyrometer error, actual temperature differences, gas flow differences, boundary layer effects, wafer sliding, among others.

Thus, there is a need for an apparatus and method enabling more precise alignment of a susceptor in a thermal processing chamber.

SUMMARY

The embodiments described herein generally relate to methods and apparatus for aligning a susceptor in a thermal processing chamber, such as an epitaxial deposition chamber or a rapid thermal processing chamber, among other chambers utilized to thermally process substrates.

In one embodiment, a thermal processing chamber is provided. The thermal process chamber includes a susceptor, a stem coupled to the susceptor, and a motion assembly coupled to the stem, the motion assembly comprising a lateral adjustment device and a tilt adjustment mechanism adapted to position a major surface of the susceptor in plane that is parallel to an X-Y plane of the chamber and position the stem along a longitudinal axis of the chamber.

In another embodiment, a thermal processing chamber is provided. The thermal process chamber includes a susceptor, a stem coupled to the susceptor, and a motion assembly coupled to the stem, the motion assembly comprising a lateral adjustment device and a tilt adjustment mechanism adapted to position a major surface of the susceptor in plane that is parallel to an X-Y plane of the chamber and position the stem along a longitudinal axis of the chamber, wherein the motion assembly comprises at least two flexible seals, and wherein the lateral adjustment device comprises an X adjustment plate and a Y adjustment plate that are coupled to adjacent sides of a base plate disposed adjacent to one of the at least two flexible seals.

In another embodiment, a stem assembly for coupling a susceptor to a process chamber is provided. The stem assembly includes a pivot mechanism having a stem disposed therethrough, a vertical actuator coupled to the stem, a rotary actuator disposed in a housing coupled to the stem, a first flexible seal coupled between the pivot mechanism and a bracket of the vertical actuator, a second flexible seal coupled to the bracket and a base plate of the rotary actuator, and a motion assembly adapted to move the housing in an X axis, a Y axis and position the susceptor angularly relative to an X-Y plane of the process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A and 4B are schematic cross-sectional views showing one embodiment of an installation and alignment procedure of a susceptor.

FIGS. 5A-5C are schematic cross-sectional views showing another embodiment of an installation and alignment procedure of a susceptor.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to methods and apparatus for aligning a susceptor in a thermal processing chamber, such as an epitaxial deposition chamber or a rapid thermal processing chamber, among other chambers utilized to thermally process substrates.

Figure 1:
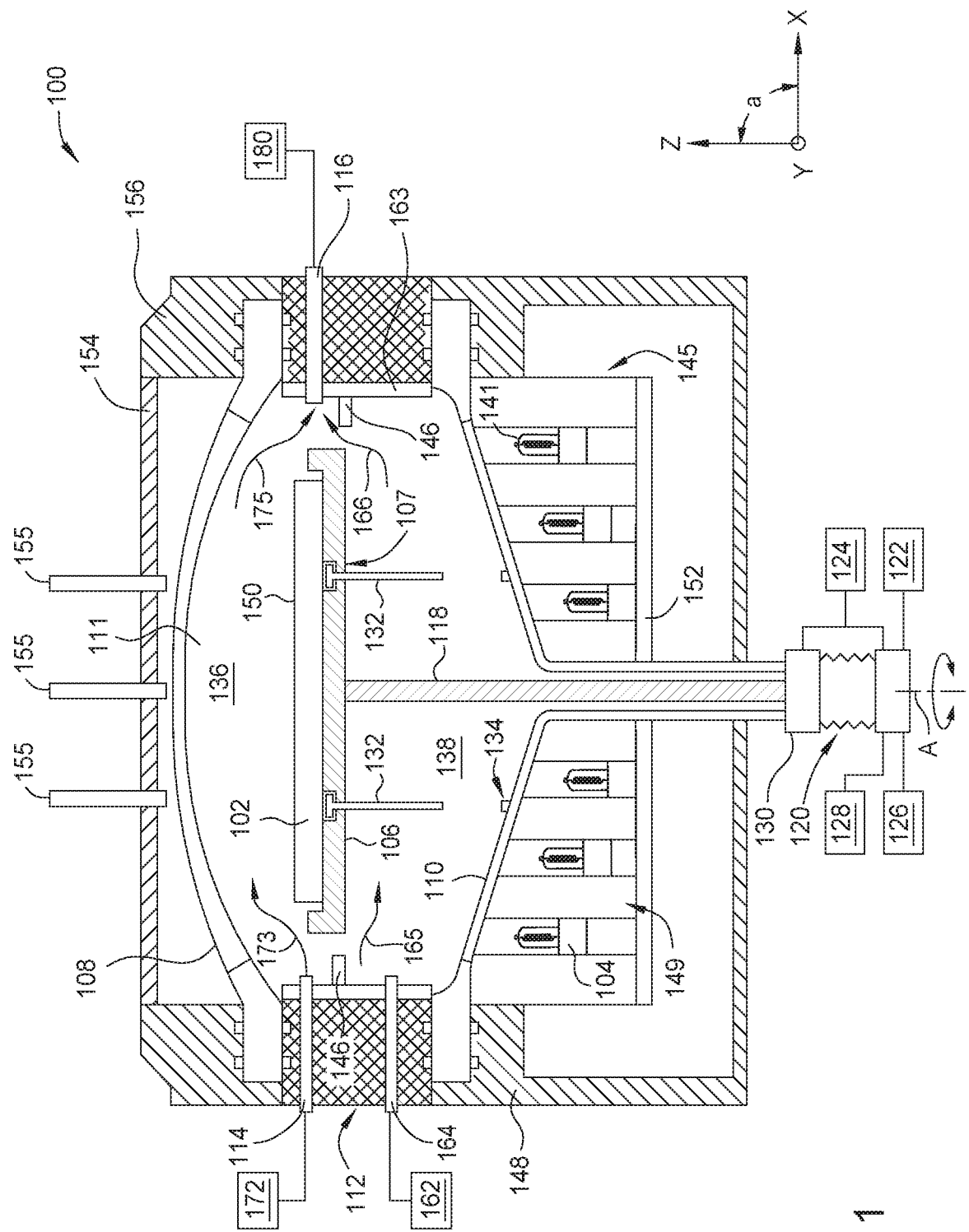
FIG. 1 illustrates a schematic sectional view of a thermal processing chamber.

FIG. 1 illustrates a schematic sectional view of a thermal processing chamber 100 according to one embodiment. The thermal processing chamber 100 may be used as an epitaxial deposition chamber, a rapid thermal processing chamber, or other thermal treatment chamber. The process chamber 100 may be used to process one or more substrates, including the deposition of a material on an upper surface of a substrate 102, heating of a substrate 102, etching of a substrate 102, or combinations thereof. The process chamber 100 generally includes an array of radiant heating lamps 104 for heating, among other components, a susceptor 106 disposed within the process chamber 100. The susceptor 106 may be a disk-like substrate support as shown, or may be a ring-like substrate support (not shown), which supports the substrate from the edge of the substrate, which exposes a backside of the substrate 102 to heat from the radiant heating lamps 104. The susceptor 106 may be formed from silicon carbide or graphite coated with silicon carbide to absorb radiant energy from the lamps 104 and conduct the radiant energy to the substrate 102, thereby heating the substrate 102.

The susceptor 106 is located within the process chamber 100 between an upper dome 108 and a lower dome 110. The upper dome 108 and the lower dome 110, along with a base ring 112 that is disposed between the upper dome 108 and lower dome 110, generally define an internal region 111 of the process chamber 100. The substrate 102 can be transferred into the process chamber 100 and positioned onto the susceptor 106 through a loading port (not shown) formed in the base ring 112. A process gas inlet 114 and a gas outlet 116 may be provided in the base ring 112.

The susceptor 106 includes a shaft or stem 118 that is coupled to a motion assembly 120. The motion assembly 120 includes one or more actuators and/or adjustment devices that provide movement and/or adjustment of the stem 118 and/or the susceptor 106 within the internal region 111. For example, the motion assembly 120 may include a rotary actuator 122 that rotates the susceptor 106 about a longitudinal axis A of the process chamber 100. The longitudinal axis A may include a center of an X-Y plane of the process chamber 100. The motion assembly 120 may include a vertical actuator 124 to lift and lower the susceptor 106 in the Z direction. The motion assembly 120 may include a tilt adjustment device 126 that is used to adjust a planar orientation of the susceptor 106 in the internal region 111. The motion assembly 120 may also include a lateral adjustment device 128 that is utilized to adjust the positioning of the stem 118 and/or the susceptor 106 side to side within the internal region 111. In embodiments where one or both of the following is necessary, the lateral adjustment device 128 is utilized to adjust positioning of the stem 118 and/or the susceptor 106 in the X and/or Y direction while the tilt adjustment device 126 adjusts an angular orientation (α) of the stem 118 and/or the susceptor 106. In one embodiment, the motion assembly 120 includes a pivot mechanism 130. As the lower dome 110 is rigidly fixed to the process chamber 100 by the base ring 112, the pivot mechanism 130 is utilized to allow the motion assembly 120 to move the stem 118 and/or the susceptor 106 at least in the angular orientation (α) to reduce stresses on the lower dome 110.

The susceptor 106 is shown in an elevated processing position but may be lifted or lowered vertically by the motion assembly 120 as described above. The susceptor 106 may be lowered to a transfer position (below the processing position) to allow lift pins 132 to contact the lower dome 110. The lift pins 132 are disposed in holes in the susceptor 106 and as the susceptor 106 is lowered, the lift pins 132 raise the substrate 102 from the susceptor 106. A robot (not shown) may then enter the process chamber 100 to engage and remove the substrate therefrom though the loading port. A new substrate 102 may be loaded onto the lift pins 132 by the robot, and the susceptor 106 may then be actuated up to the processing position to place the substrate 102, with its device side 150 facing up. The lift pins 132 include an enlarged head allowing the lift pins 132 to be suspended in openings by the susceptor 106 in the processing position. In one embodiment, stand-offs 134 coupled to the lower dome 110 are utilized to provide a flat surface for the lift pins 132 to contact. The stand-offs provide a surface that is parallel to the X-Y plane of the process chamber 100 and may be used to prevent binding of the lift pins 132 that may occur if the end thereof is allowed to contact the curved surface of the lower dome 110. The stand-offs 134 may be made of an optically transparent material to allow energy from the lamps 104 to pass therethrough.

The susceptor 106, while located in the processing position, divides the internal volume of the process chamber 100 into a process gas region 136 that is above the susceptor 106, and a purge gas region 138 below the susceptor 106. The susceptor 106 is rotated during processing by the rotary actuator 122 to minimize the effect of thermal and process gas flow spatial anomalies within the process chamber 100 and thus facilitates uniform processing of the substrate 102. The susceptor 106 is supported by the stem 118, which is generally centered on the susceptor 106 and facilitates movement of the susceptor 106 substrate 102 in a vertical direction (Z direction) during substrate transfer, and in some instances, processing of the substrate 102.

In general, the central window portion of the upper dome 108 and the bottom of the lower dome 110 are formed from an optically transparent material such as quartz. The thickness and the degree of curvature of the upper dome 108 may be configured to provide a flatter geometry for uniform flow uniformity in the process chamber.

One or more lamps, such as an array of the radiant heating lamps 104, can be disposed adjacent to and beneath the lower dome 110 in a specified manner around the stem 118. The radiant heating lamps 104 may be independently control or controlled in zones in order to control the temperature of various regions of the substrate 102 as the process gas passes thereover, thereby facilitating the deposition of a material onto the upper surface of the substrate 102. While not discussed here in detail, the deposited material may include silicon, doped silicon, germanium, doped germanium, silicon germanium, doped silicon germanium, gallium arsenide, gallium nitride, or aluminum gallium nitride.

The radiant heating lamps 104 may include a radiant heat source, depicted here as a lamp bulb 141, and may be configured to heat the substrate 102 to a temperature within a range of about 200 degrees Celsius to about 1,600 degrees Celsius. Each lamp bulb 141 can be coupled to a standoff a power distribution board, such as printed circuit board (PCB) 152, through which power is supplied to each lamp bulb 141. In one embodiment, the radiant heating lamps 104 are positioned within a lamphead 145 which may be cooled during or after processing.

A circular shield 146 may be optionally disposed around the susceptor 106 and coupled to sidewall of the chamber body 148. The shield 146 prevents or minimizes leakage of heat/light noise from the lamps 104 to the device side 150 of the substrate 102 in addition to providing a pre-heat zone for the process gases. The shield 146 may be made from CVD SiC, sintered graphite coated with SiC, grown SiC, opaque quartz, coated quartz, or any similar, suitable material that is resistant to chemical breakdown by process and purge gases. In some embodiments, the shield 146 is coupled to a liner 163 disposed on the base ring 112.

Substrate temperature is provided by sensors configured to measure temperatures at the bottom of the susceptor 106. The sensors may be pyrometers (not shown) disposed in ports formed in the lamphead 145. Additionally or alternatively, one or more sensors 155, such as a pyrometer, may be directed to measure the temperature of the device side 150 of the substrate 102. A reflector 154 may be optionally placed outside the upper dome 108 to reflect infrared light that is radiating off the substrate 102 and redirect the energy back onto the substrate 102. The reflector 154 may be secured to the upper dome 108 using a clamp ring 156. The reflector 154 can be made of a metal such as aluminum or stainless steel.

Process gas supplied from a process gas supply source 172 is introduced into the process gas region 136 through the process gas inlet 114 formed in the sidewall of the base ring 112. The process gas inlet 114 is configured to direct the process gas in a generally radially inward direction. During a film formation process, the susceptor 106 is located in the processing position, which is adjacent to and at about the same elevation as the process gas inlet 114, thus allowing the process gas to flow generally along flow path 173 across the upper surface of the substrate 102. The process gas exits the process gas region 136 (along flow path 175) through the gas outlet 116 located on the opposite side of the process chamber 100 as the process gas inlet 114. Removal of the process gas through the gas outlet 116 may be facilitated by a vacuum pump 180 coupled thereto.

Purge gas supplied from a purge gas source 162 is introduced to the purge gas region 138 through a purge gas inlet 164 formed in the sidewall of the base ring 112. The purge gas inlet 164 is disposed at an elevation below the process gas inlet 114. If the circular shield 146 is used, the circular shield 146 may be disposed between the process gas inlet 114 and the purge gas inlet 164. In either case, the purge gas inlet 164 is configured to direct the purge gas in a generally radially inward direction. If desired, the purge gas inlet 164 may be configured to direct the purge gas in an upward direction. During a film formation process, the susceptor 106 is located at a position such that the purge gas flows generally along flow path 165 across a back side of the susceptor 106. The purge gas exits the purge gas region 138 (along flow path 166) and is exhausted out of the process chamber through the gas outlet 116 located on the opposite side of the process chamber 100 as the purge gas inlet 164.

Figure 2:
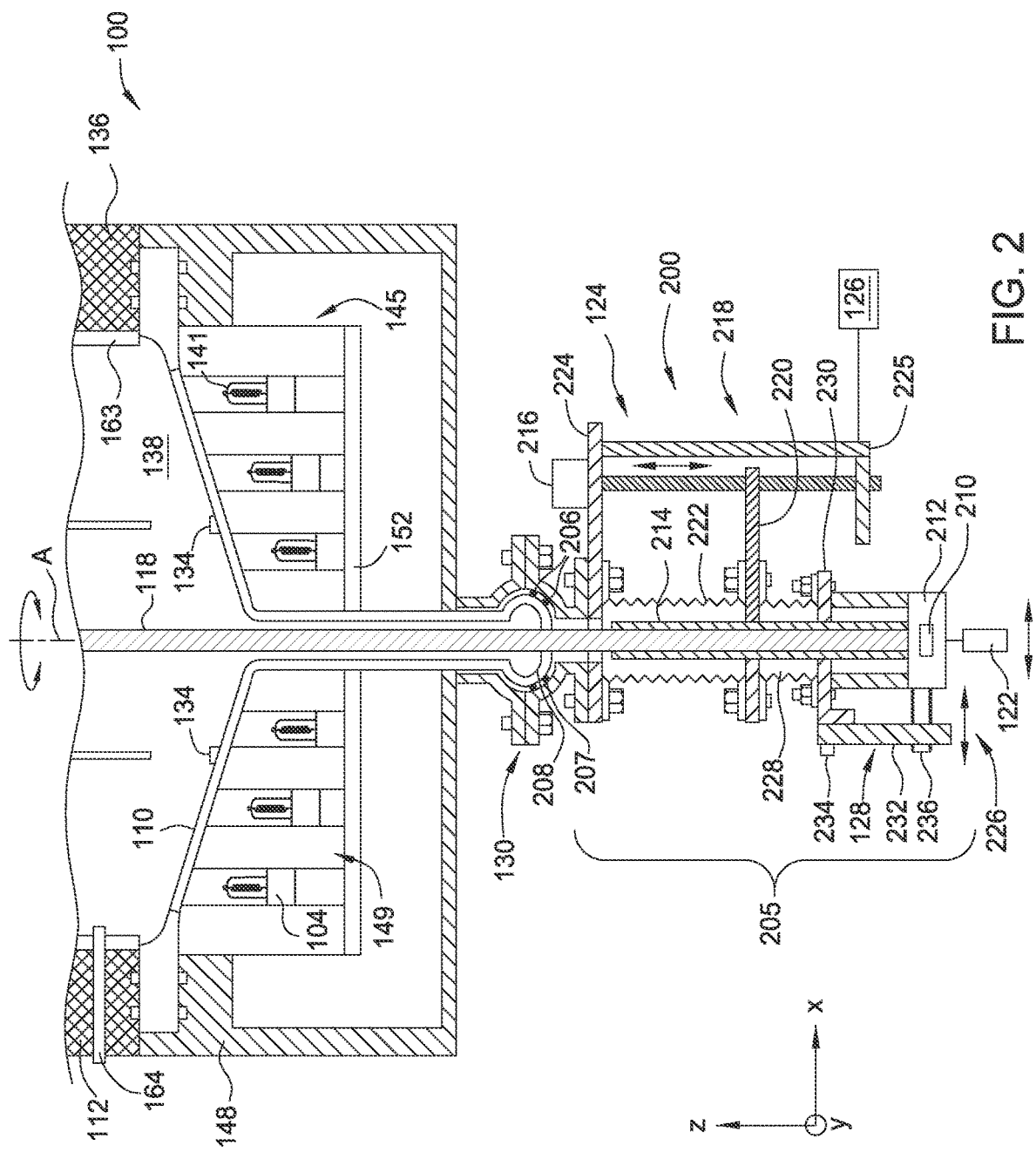
FIG. 2 is a side cross-sectional view of a portion of the process chamber of FIG. 1 showing one embodiment of a motion assembly.

FIG. 2 is a side cross-sectional view of a portion of the process chamber 100 of FIG. 1 showing one embodiment of a motion assembly 200. The motion assembly 200 may be used as the motion assembly 120 of FIG. 1. The motion assembly 200 includes a pivot mechanism 130 which allows a movable portion 205, which is operably coupled to the stem 118, to move at least angularly relative to the lower dome 110. Dynamic seals 206, which may be an elastomeric o-ring, may be coupled between an outer housing 207 and an inner portion 208 of the lower dome 110. The movable portion 205 includes the rotary actuator 122 that is coupled to a rotary stage 210 disposed in a housing 212. In some embodiments, the rotary stage 210 is operably coupled to the stem 118 by a tube 214. The rotary stage 210 may be coupled to the tube 214 by a magnetic coupling. The tube 214 includes an inner dimension sized to receive an outer diameter of the stem 118. The tube 214 captures and vertically supports the stem 118. The tube 214 and/or the stem 118 may include fasteners or indexing features (i.e., flats, grooves, and the like) that facilitate positive engagement therebetween to facilitate rotation of the stem 118 based on rotation of the rotary stage 210.

The movable portion 205 also includes a vertical actuator 124, which may include a rotary motor 216 that is operably coupled to the stem 118. In one embodiment, the vertical actuator 124 includes a screw drive 218 coupled to the rotary motor 216 and one or more brackets 220 that are coupled to the stem 118. The bracket(s) 220 may be coupled to the tube 214 when the tube 214 is used. Rotation of the screw drive 218 raises or lowers the stem 118 (having the susceptor 106 (shown in FIG. 1) coupled thereto) in the Z direction. A first flexible seal 222, such as a bellows, may be disposed between a base 224 of the vertical actuator 124 and the one or more brackets 220.

The motion assembly 200 also includes an adjustment portion 226 operably coupled to one or more components of the movable portion 205. The adjustment portion 226 includes the lateral adjustment device 128 and the tilt adjustment device 126. The adjustment portion 226 also includes a second flexible seal 228, such as a bellows. The second flexible seal 228 is adapted to move independently of the first flexible seal 222, and vice-versa. The second flexible seal 228 allows all components within the motion assembly 200 to share the same environment as the purge gas region 138 of the process chamber 100 up to the rotary stage 210, in one embodiment. Thus, a reduced pressure environment may be contained in the motion assembly 200 while the rotary stage 210 is in ambient pressures. The second flexible seal 228 may terminate at a base plate 230 of the housing 212 of the rotary stage 210.

The lateral adjustment device 128 and the tilt adjustment device 126 may comprise a manual adjustment apparatus for centering of the stem 118 as well as adjusting planarity and/or tilt of the stem 118 and the susceptor 106 coupled thereto. In some embodiments, the vertical actuator 124 includes a bracket 225 that extends vertically from the base 224. The bracket 225 may be integral to the vertical actuator 124 and may be substantially parallel to a longitudinal axis of the stem 118. Substantially parallel as used herein includes parallel (e.g., 0 degrees relative to the longitudinal axis A) as well as a +/−5 degree angle, or less, relative to the longitudinal axis A. The tilt adjustment device 126 may move the base 224 laterally in the X and/or the Y direction by pushing or pulling on the bracket 225, which may be used to adjust the tilt of the stem 118 and/or the planarity of the susceptor 106. The tilt adjustment device 126 may be an actuator, a screw, or other adjustable fastener that pushes or pulls on the bracket 225. In one embodiment, the lateral adjustment device 128 may include an X adjustment plate 232 that is coupled to the base plate 230 by a fastener 234, such as by a bolt or screw. The base plate 230 may be disposed at an angle that is substantially normal to the stem 118 and/or parallel to a plane of a surface of the susceptor 106 (shown in FIG. 1), and the X adjustment plate 232 may be disposed at an angle that is substantially normal to a plane of the base plate 230 and/or the rotational axis of the stem 118. Substantially normal as used herein includes 90 degrees as well as +/−5 degrees, or less.

The X adjustment plate 232 includes an adjustment feature 236, which may be a set screw that contacts a surface of the housing 212 of the rotary stage 210. The adjustment feature 236 may push and/or pull the housing 212 to displace the housing 212 in the X direction. The displacement of the housing 212 is utilized to center the stem 118 relative to the lower dome 110 and/or center the susceptor 106 relative to the circular shield 146 (shown in FIG. 1). While not shown in this view, a Y adjustment plate may be coupled to the base plate 230 and operates similar to the X adjustment plate 232 except for providing displacement in the Y direction. When the stem 118 is out of alignment with the longitudinal axis A, which may cause the susceptor 106 to tilt, the tilt adjustment device 126 may be utilized to correct the tilt of the susceptor 106. The displacement of the housing 212 may be limited to the portion of the motion assembly 200 below the base plate 230 which allows the first flexible seal 222 to remain on-axis (i.e., centered about the stem 118). Any transverse displacement in the assembly is accommodated by the second flexible seal 228 which moves in the X and/or Y direction while the first flexible seal 222 remains substantially parallel to the longitudinal axis A. Thus, expansion and contraction of the second flexible seal 228 is limited or non-existent, which reduces fatigue and extends the lifetime of the second flexible seal 228. In some embodiments, the first flexible seal 222 is substantially limited to movement along the longitudinal axis A of the process chamber 100 while the second flexible seal 228 is substantially limited to lateral movement (in the X and Y directions) of the process chamber 100. Substantially limited in movement as used herein includes no movement as well as movement within 5 millimeters, or less.

Figure 3:
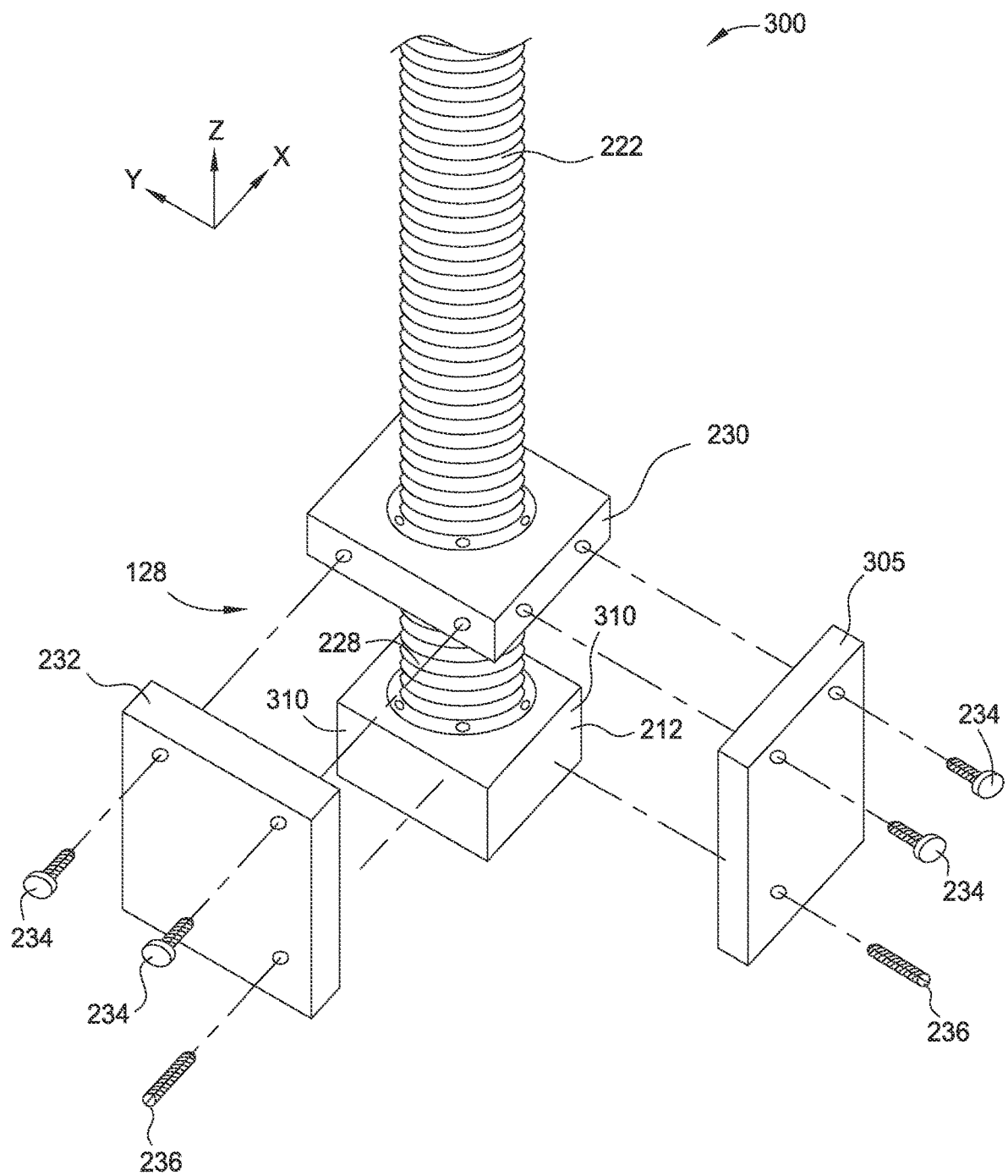
FIG. 3 is an exploded isometric view of one embodiment of an adjustment portion of the motion assembly of FIG. 2.

FIG. 3 is an exploded isometric view of one embodiment of an adjustment portion 300 of the motion assembly 200 of FIG. 2. The adjustment portion 300 includes the X adjustment plate 232 that is adapted to couple to the base plate 230 using one or more fasteners 234. A Y adjustment plate 305 may also be coupled to the base plate 230 at a substantially orthogonal angle relative to the X adjustment plate 232 using one or more fasteners 234. Both of the X adjustment plate 232 and the Y adjustment plate 305 include at least one adjustment feature 236 that contacts a surface 310 of the housing 212. The adjustment feature 236 may be rotated toward or away from the housing 212 for transverse adjustment of the housing 212 and the stem 118 (shown in FIG. 2) in order to center the stem 118 in the X-Y plane of the process chamber 100 (shown in FIG. 1).

The adjustment features 236 utilized on the X adjustment plate 232 and the Y adjustment plate 305 may be a set screw that is rotated against the surfaces 310 of the housing 212 and pushes the housing 212 away from a respective plate 232 or 305, in one embodiment. In another embodiment, the adjustment features 236 may engage the surfaces 310 such that rotation of the adjustment features 236 pulls the housing 212 toward a respective plate 232 or 305.

FIGS. 4A and 4B are schematic cross-sectional views showing one embodiment of an installation and alignment procedure 400 of a susceptor 106. The installation and alignment procedure 400 includes an initial installation of the susceptor 106. The susceptor 106 may be inserted into the tube 214 (shown in FIG. 2) and coupled to the rotary stage 210 within the housing 212 by a magnetically-coupled drive assembly. As shown in FIG. 4A, the susceptor 106 is off-center (i.e., misaligned in X-Y). As shown in FIG. 4B, the adjustment feature 236 provided in a bracket 405 moves the housing 212 in the X direction, which moves the stem 118 and the susceptor 106 in the X direction thereby substantially centering the stem 118 and the susceptor 106 relative to the circular shield 146. While not shown, the stem 118 and the susceptor 106 may be adjusted in the Y direction if needed.

FIGS. 5A-5C are schematic cross-sectional views showing another embodiment of an installation and alignment procedure 500 of a susceptor 106. The installation and alignment procedure 500 includes an initial installation of the susceptor 106 in the stem assembly similar to FIG. 4A, except the stem 118 and the susceptor 106 are tilted relative to the longitudinal axis A and the X-Y plane, respectively, as shown in FIG. 5A.

FIG. 5B shows a tilt correction provided by the tilt adjustment device 126. The tilt adjustment device 126 is utilized to push against the bracket 405 which alleviates the tilt of the susceptor 106. Thus, one or both major surfaces 505A, 505B of the susceptor 106 may be parallel to the X-Y plane, which provides uniform processing of a substrate (as opposed to a tilted susceptor) which reduces chamber matching problems, among other processing issues.

FIG. 5C shows a transverse alignment correction provided by the lateral adjustment device 128, which generally centers the susceptor 106 relative to the circular shield 146.

Embodiments of the tilt adjustment device 126 and the lateral adjustment device 128 provide more precise alignment and/or positioning of a susceptor 106 in a process chamber. The embodiments disclosed herein provide positioning of a susceptor that may be aligned simultaneously in tilt and centering. The positioning is achieved by providing separate actuation of the tilt alignment and the centering alignment. According to the embodiments, four degrees of freedom in alignment control are provided, such as tilt correction along the X-axis, tilt correction along the Y-axis, translation along the X-axis, and translation along the Y-axis. Correction of tilt may move the entire assembly (i.e., X and Y alignment devices, Z motion alignment and rotation devices). The centering and tilt correction provided by the embodiments reduces chamber matching issues, among other processing non-uniformities. The second flexible seal 228 may be adapted to move only in X and/or Y directions while the first flexible seal 222 moves primarily in the vertical (Z) direction. This differs from conventional susceptor assemblies where a single bellows assembly (which may be a bellows device coupled directly to and extending from another bellows device) is typically utilized such that the entire assembly is subject to tilt and multiple cycles of expansion and contraction. However, the first flexible seal 222 and the separate second flexible seal 228 limits fatigue of the seals by reducing transverse displacement in the first flexible seal 222 and reducing expansive/contractive movement in the second flexible seal 228.

Tilting of the stem 118 and/or the susceptor 106 may be inherent due to multiple tolerances when assembling dozens of parts together in the construction of the thermal processing chamber 100. The inner portion 208 of the lower dome 110 within the pivot mechanism 130 has no vertical reference. Hence, the tilt adjustment device 126 is utilized to correct this tilt that may be caused by the tolerances of the parts when assembled. In one embodiment, correction of the tilt may be carried out by using the tilt adjustment device 126 before any lateral correction is provided. Then centering of the susceptor 106 (pure X-Y) relative to the circular shield 146 may be performed using the lateral adjustment device 128. Although not impossible, it has been determined that it is difficult to perform X-Y adjustments before tilt adjustment because tilt adjustment affects X-Y centering while X-Y centering does not affect tilt.

While the foregoing is directed to embodiments of the present disclosure, other and further embodiments of the disclosure may be devised without departing from the basic scope thereof, and the scope thereof is determined by the claims that follow.

The invention claimed is:

1. A thermal processing chamber comprising:
a chamber body;
a base ring coupled to the chamber body;
a susceptor positioned between an upper dome and a lower dome, the chamber body surrounding the lower dome, wherein the lower dome is rigidly fixed to the base ring and comprises a pivot mechanism coupled to the chamber body;
a stem coupled to the susceptor; and
a motion assembly coupled to the stem outside of the lower dome, the motion assembly comprising a lateral adjustment device and a tilt adjustment mechanism, both adapted to position a major surface of the susceptor in plane that is parallel to an X-Y plane of the chamber and position the stem along a longitudinal axis of the chamber, and the motion assembly comprises a rotary stage to rotate the susceptor, wherein the pivot mechanism is configured to provide angular movement of the motion assembly relative to the lower dome.

2. The chamber of claim 1, wherein the motion assembly comprises at least two flexible seals.

3. The chamber of claim 2, wherein one of the at least two flexible seals is substantially limited to movement in an X axis or a Y axis.

4. The chamber of claim 2, wherein one of the at least two flexible seals is substantially limited to movement along the longitudinal axis of the chamber.

5. The chamber of claim 2, wherein the lateral adjustment device comprises an X adjustment plate and a Y adjustment plate that are coupled to adjacent sides of a base plate disposed adjacent to one of the at least two flexible seals.

6. The chamber of claim 5, wherein each of the X adjustment plate and the Y adjustment plate comprises a set screw that is coupled to a housing coupled to the stem.

7. The chamber of claim 1, wherein the motion assembly further comprises a vertical actuator having a base disposed in a plane that is substantially normal to the longitudinal axis, and a bracket disposed in a plane that is substantially normal to the plane of the base.

8. The chamber of claim 7, wherein the tilt adjustment mechanism pushes or pulls on the bracket to adjust an angular orientation of the stem.

9. The chamber of claim 1, wherein the motion assembly is coupled to the lower dome.

10. The chamber of claim 1, wherein the pivot mechanism comprises a dynamic seal coupled between an outer housing and an inner portion of the lower dome.

11. A thermal processing chamber comprising:
a chamber body;
a base ring coupled to the chamber body;
a susceptor positioned between an upper dome and a lower dome, the lower dome rigidly fixed to the base ring, wherein the lower dome is positioned within the chamber body, and the lower dome comprises a pivot mechanism coupled to the chamber body;
a stem coupled to the susceptor, the stem extending at least partially through the pivot mechanism; and
a motion assembly coupled to the stem outside of the lower dome, the motion assembly comprising:
a rotary stage coupled to a tube that receives a portion of the stem; and
a lateral adjustment device and a tilt adjustment mechanism, both adapted to position a major surface of the susceptor in plane that is parallel to an X-Y plane of the chamber and position the stem along a longitudinal axis of the chamber, wherein the motion assembly comprises at least two flexible seals, and wherein the lateral adjustment device comprises an X adjustment plate and a Y adjustment plate that are coupled to adjacent sides of a base plate disposed adjacent to one of the at least two flexible seals.

12. The chamber of claim 11, wherein each of the X adjustment plate and the Y adjustment plate comprises a set screw that is coupled to a housing coupled to the stem.

13. The chamber of claim 11, wherein the motion assembly further comprises a vertical actuator having a base disposed in a plane that is substantially normal to the longitudinal axis, and a bracket disposed in a plane that is substantially normal to the plane of the base.

14. The chamber of claim 13, wherein the tilt adjustment mechanism pushes or pulls on the bracket to adjust an angular orientation of the stem.

15. The chamber of claim 11, wherein the motion assembly is coupled to the lower dome.

16. The chamber of claim 15, wherein the pivot mechanism comprises a housing and a dynamic seal disposed between the lower dome and the housing.

* * * * *